United States Patent
Loubet et al.

(10) Patent No.: US 9,190,517 B2
(45) Date of Patent: Nov. 17, 2015

(54) METHODS FOR MAKING A SEMICONDUCTOR DEVICE WITH SHAPED SOURCE AND DRAIN RECESSES AND RELATED DEVICES

(71) Applicants: STMICROELECTRONICS, INC., Coppell, TX (US); INTERNATIONAL BUSINESS MACHINES CORPORATION, Armonk, NY (US)

(72) Inventors: Nicolas Loubet, Guilderland, NY (US); Douglas Latulipe, Guilderland, NY (US); Alexander Reznicek, Troy, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/518,590

(22) Filed: Oct. 20, 2014

(65) Prior Publication Data

US 2015/0054032 A1    Feb. 26, 2015

Related U.S. Application Data

(62) Division of application No. 13/905,534, filed on May 30, 2013, now Pat. No. 8,900,978.

(51) Int. Cl.
  *H01L 29/78*   (2006.01)
  *H01L 27/092*  (2006.01)
  *H01L 29/417*  (2006.01)
  *H01L 29/165*  (2006.01)
  *H01L 29/66*   (2006.01)

(52) U.S. Cl.
  CPC .......... *H01L 29/7848* (2013.01); *H01L 27/092* (2013.01); *H01L 29/165* (2013.01); *H01L 29/41783* (2013.01); *H01L 29/66636* (2013.01)

(58) Field of Classification Search
  None
  See application file for complete search history.

(56) References Cited

U.S. PATENT DOCUMENTS

| | | | |
|---|---|---|---|
| 8,642,417 B2 * | 2/2014 | Cheng et al. | 438/199 |
| 2007/0018205 A1 * | 1/2007 | Chidambarrao et al. | 257/288 |
| 2008/0237634 A1 | 10/2008 | Dyer et al. | |
| 2010/0203732 A1 | 8/2010 | Doris et al. | |
| 2011/0183481 A1 | 7/2011 | Dyer | |
| 2012/0142121 A1 | 6/2012 | Khare et al. | |
| 2012/0252174 A1 | 10/2012 | Dutartre et al. | |
| 2012/0319203 A1 * | 12/2012 | Cheng et al. | 257/346 |
| 2013/0001698 A1 * | 1/2013 | Waite et al. | 257/365 |
| 2013/0052801 A1 | 2/2013 | Berliner et al. | |
| 2013/0115759 A1 | 5/2013 | Park et al. | |
| 2013/0119444 A1 * | 5/2013 | Cheng et al. | 257/288 |

OTHER PUBLICATIONS

Definition of "inclined", downloaded from URL<http://www.merriam-webster.com/dictionary/inclined>, on Apr. 11, 2014. 1 pg.

* cited by examiner

*Primary Examiner* — Joseph Schoenholtz
(74) *Attorney, Agent, or Firm* — Allen, Dyer, Doppelt, Milbrath & Gilchrist, P.A.

(57) ABSTRACT

A method for making a semiconductor device includes forming at least one gate stack on a layer comprising a first semiconductor material and etching source and drain recesses adjacent the at least one gate stack. The method further includes shaping the source and drain recesses to have a vertical side extending upwardly from a bottom to an inclined extension adjacent the at least one gate stack.

23 Claims, 9 Drawing Sheets

METHODS FOR MAKING A SEMICONDUCTOR DEVICE WITH SHAPED SOURCE AND DRAIN RECESSES AND RELATED DEVICES

FIELD OF THE INVENTION

The present invention relates to the field of electronic devices, and more particularly, to semiconductor devices and related methods.

BACKGROUND OF THE INVENTION

Semiconductor devices, such as semiconductor integrated circuit (IC's), include numerous semiconductor device structures. Examples are insulated-gate transistors, such as Complementary Metal Oxide Semiconductor (CMOS) transistors, which include both P-channel and N-channel MOS transistors. MOS-type transistors may be formed by gate stack deposition and patterning followed by spacer deposition and etching to form a transistor circuit having a raised source/drain structure. Active source and drain recesses are formed that may be "sigma" shaped recesses because of their similarity to the Greek letter "sigma" (Σ). This configuration may impart maximum compressive stress. Other recess configurations are "box" shaped with straight walls for lower off-state leakage. There are a number of recognized fabrication processes for building these transistors and they share a common fabrication step of selectively depositing semiconductor material above the source and drain regions to form raised source and drain structures using selective epitaxial deposition.

Epitaxial deposition is often used to control the electrical properties of the source and drain regions of insulated-gate transistors. It is possible to control the dopant levels present within single crystal regions by introducing dopants into the epitaxial silicon layers. For example, it is possible to introduce germanium (Ge) or carbon (C) atoms in order to introduce mechanical stress into the epitaxial layers and increase the mobility of charge carriers in the source and drain regions.

The epitaxial layer may be formed as a silicon germanium (SiGe) layer in proximity to the gate channel. The active source and drain shapes are often formed to impart greater compressive stress due to the epitaxial SiGe proximity, but as a result, there may be greater off-state leakage, which is detrimental to transistor function. It is desirable if the source and drain regions may be formed for greater stress while maintaining a lower off-state leakage.

SUMMARY OF THE INVENTION

A method of making a semiconductor device may include forming at least one gate stack on a layer comprising a first semiconductor material and etching source and drain recesses adjacent the at least one gate stack. The method may further include shaping the source and drain recesses to have a vertical side extending upwardly from a bottom to an inclined extension adjacent the at least one gate stack. The shaping may further include cyclically depositing and etching a second semiconductor material to form lined source and drain recesses. The method may further include filling the lined source and drain recesses with a second semiconductor material to define raised source and drain regions.

The cyclically depositing and etching and filling may be performed in the same processing chamber. The first and second semiconductor materials may be different semiconductor materials so that a stress is imparted to a channel region under the at least one gate stack. The first semiconductor material may comprise silicon, and the second semiconductor material may comprise silicon and germanium. The inclined extension may have a vertical dimension less than a vertical dimension of the vertical side. The inclined extension may have a vertical dimension less than a half vertical dimension of the vertical side. The bottom may be tapered.

A semiconductor device comprising a layer of first semiconductor material and at least one gate stack on the layer of the first semiconductor material. Source and drain regions of a second semiconductor material are adjacent the at least one gate stack. Each source and drain region has a bottom, a vertical side extending upwardly from the bottom, and an inclined extension extending from the vertical side adjacent the at least one gate stack.

The source and drain regions may comprise raised source and drain regions. The first semiconductor material layer may comprise a channel region under the at least one gate stack. The first and second semiconductor materials may be different semiconductor materials so that stress is imparted to the channel region. The first semiconductor material may comprise silicon, and the second semiconductor material may comprise silicon and germanium. The inclined extension may have a vertical dimension less than a vertical dimension of the vertical side. In another example, the inclined extension may have a vertical dimension less than half a vertical dimension of the vertical side. The bottom wall may have a tapered shape in another example.

BRIEF DESCRIPTION OF THE DRAWINGS

Other features and advantages of the present invention will become apparent from the detailed description of the invention which follows, when considered in light of the accompanying drawings in which.

DETAILED DESCRIPTION OF THE EMBODIMENTS

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

Figure 1:
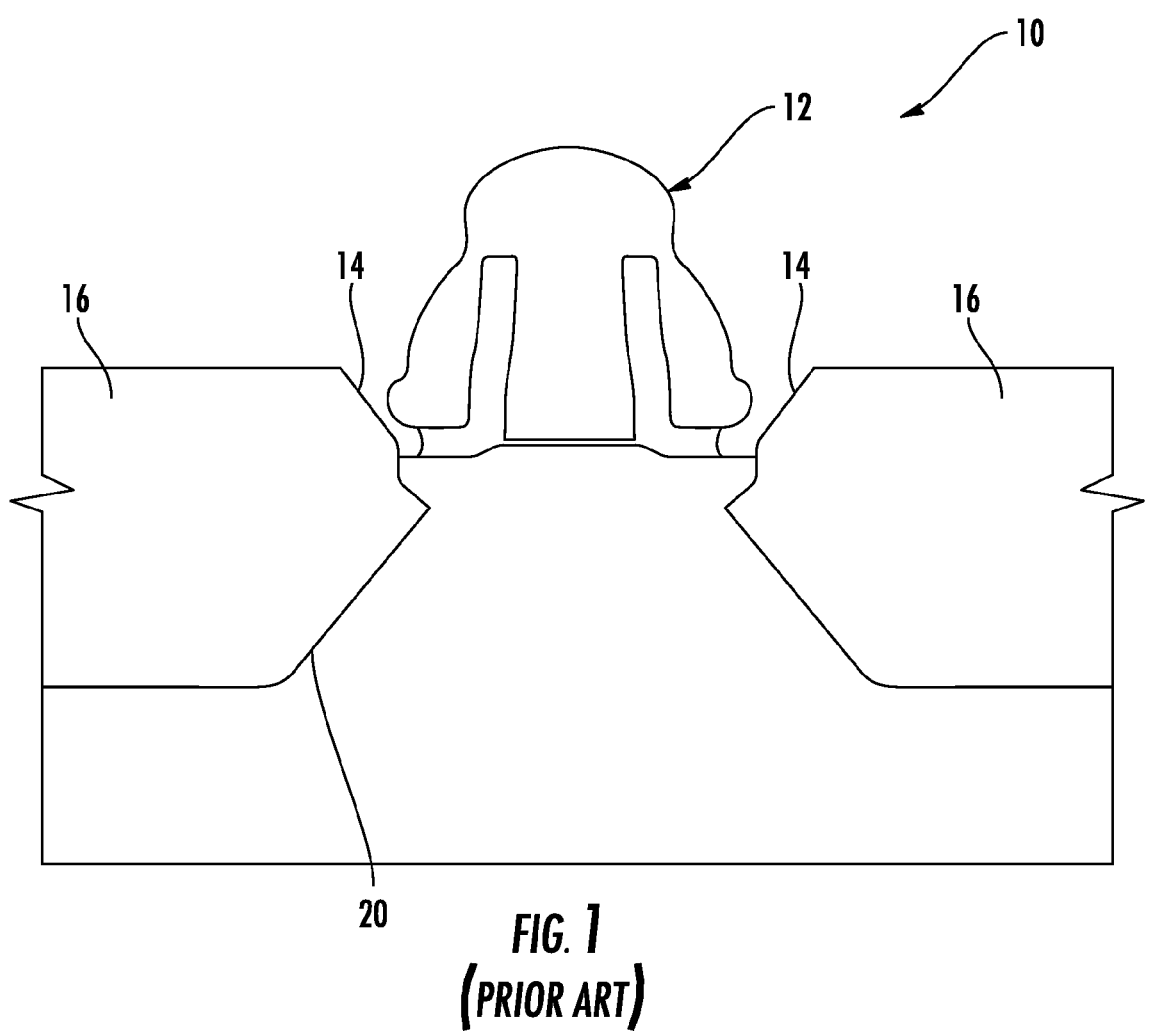
FIG. 1 is an image of a cross-sectional view of a prior art semiconductor device showing source and drain "sigma" shaped regions and a silicon germanium (SiGe) epitaxial layer adjacent the source and drain regions.

FIG. 1 is an image of a cross-sectional view of a prior art semiconductor device illustrated generally at 10 having a gate stack 12 and showing "sigma" shaped source and drain regions in recesses 14. The silicon germanium (SiGe) epitaxial layer 16 is adjacent the source and drain recesses 14. The "sigma" shaped term is defined by those skilled in the art to refer to the "sigma" shape of the Greek letter sigma (Σ) defined on the side of the source and drain recesses 14. This configuration imparts greater stress into the channel 20 due to the epitaxial SiGe proximity to the gate channel. The sigma shape of the source and drain recesses 14 imparts greater stress as compared to a straight or "box" shape of other prior art devices. A drawback of the sigma configuration, however, is its greater off-state leakage.

Conventional semiconductor processing techniques are used to form this prior art semiconductor device 10 illustrated in FIG. 1, including initial shallow trench isolation to define an active transistor device region within the silicon substrate. The gate stack 12 is deposited and patterned such as using a nitride spacer followed by spacer deposition and etching using semiconductor processing techniques known to those skilled in the art. The active source and drain recesses 14 are etched to form the "sigma" shape source and drain recess shapes, followed by cleaning, prebaking and depositing a silicon germanium (SiGe) or epitaxial silicon carbon (SiC) epitaxial layer. Final spacer and silicide formation is accomplished followed by back-end processing as known to those skilled in the art.

As noted before, the "sigma" shaped source and drain recesses 14 impart greater stress compared to a "box" shaped source and drain recesses because of the SiGe epitaxial proximity to the channel 20 and greater off-state leakage. In prior art processing techniques, the source and drain recesses 14 could be formed ex-situ by wet processing, and there was typically a requirement for a dedicated preclean and high temperature prebake before any SiGe epitaxial deposition. There was also an enhanced risk of silicon migration during the prebake and shape modification.

These disadvantages are overcome by the semiconductor device and methods in accordance with a non-limiting example as explained below with reference to FIGS. 2-9.

Figure 4:
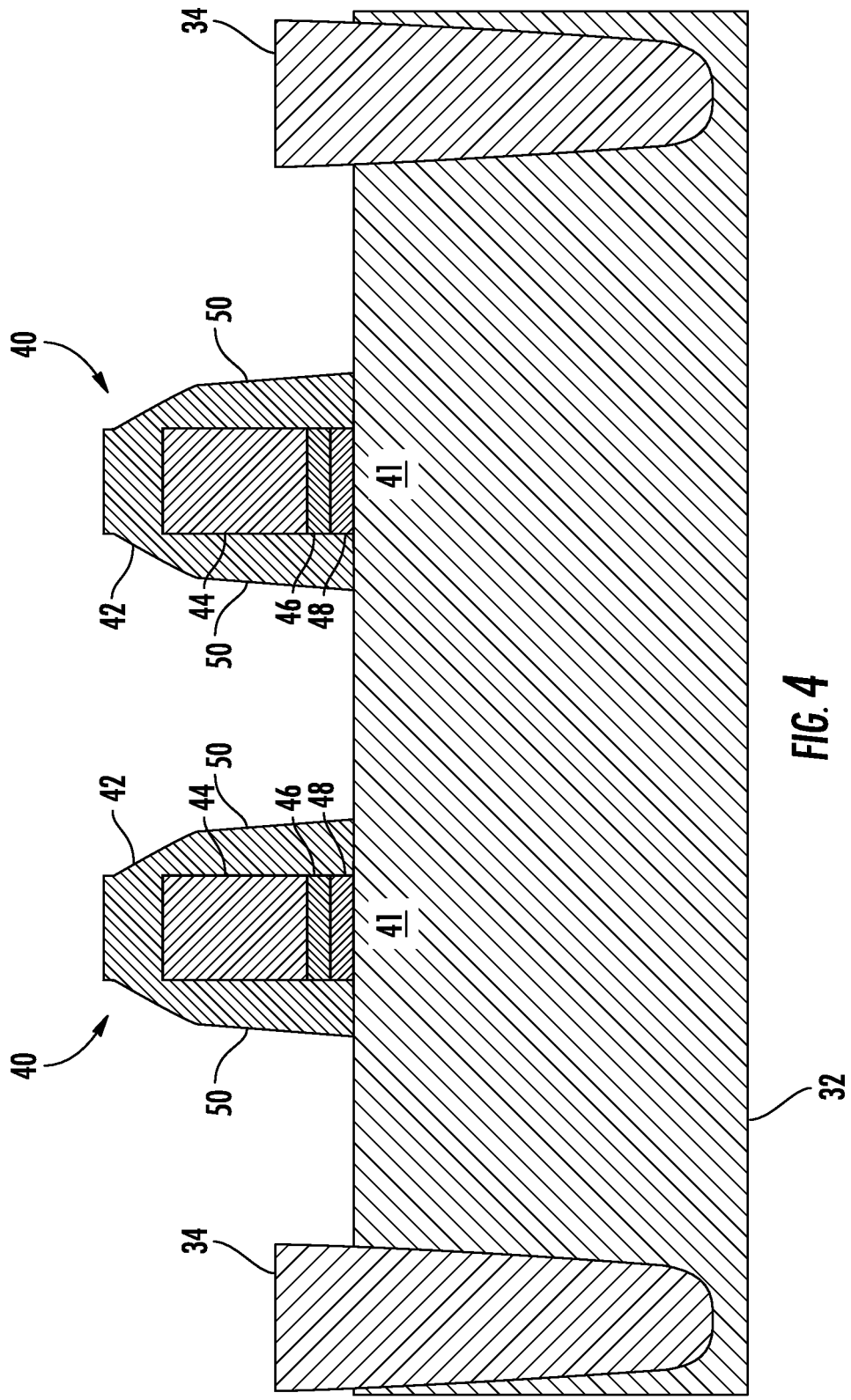
FIG. 4 is a cross-sectional view showing a third processing step of silicon nitride (SiN) deposition and reactive ion etching (RIE).
Figure 5:
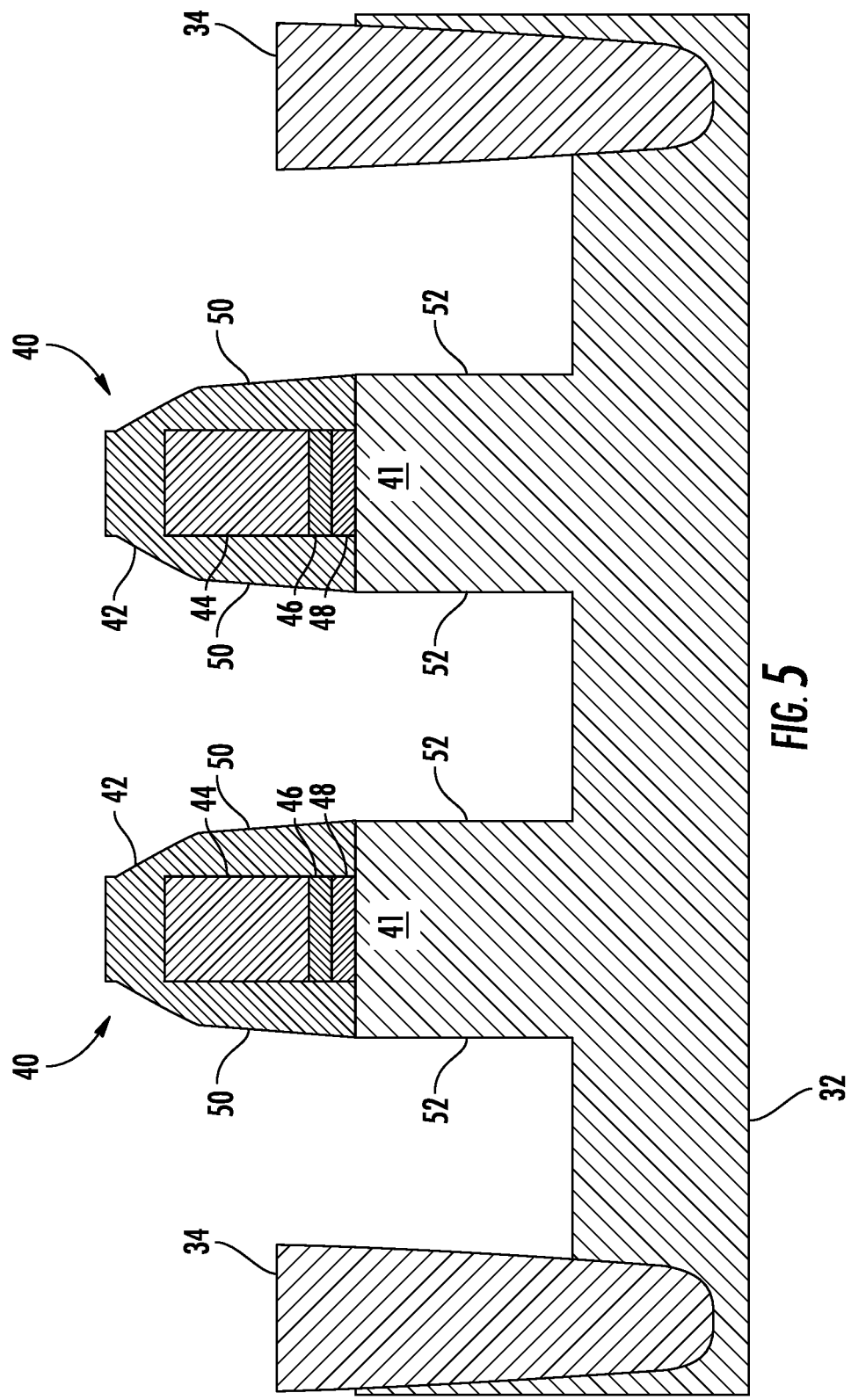
FIG. 5 is a cross-sectional view showing a fourth processing step of etching source and drain recesses adjacent the at least one gate stack.
Figure 6:
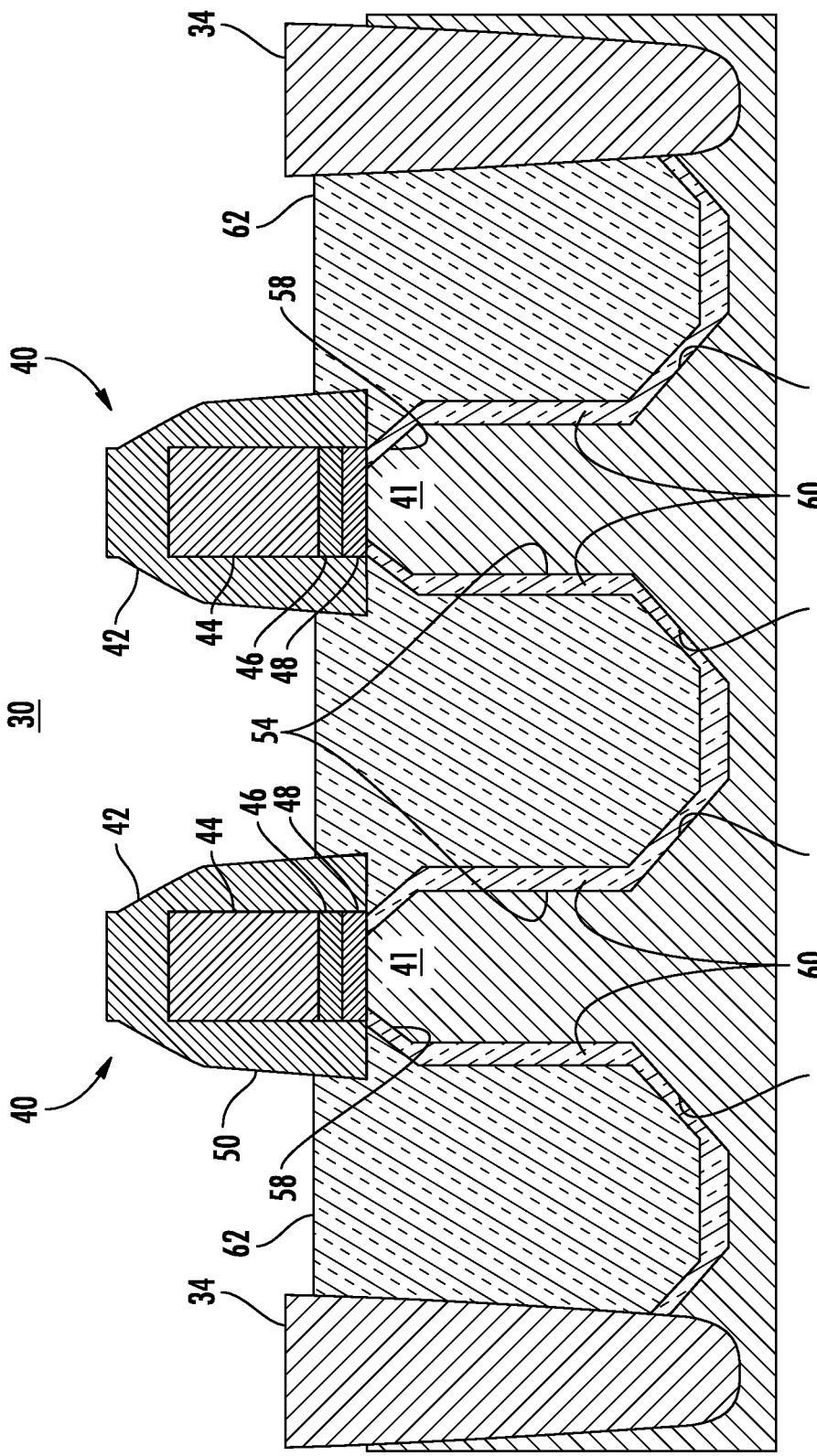
FIG. 6 is a cross-sectional view showing a fifth processing step of shaping source and drain recesses and filling with a second semiconductor material to form the semiconductor device in accordance with a non-limiting example of the present invention.
Figure 7:
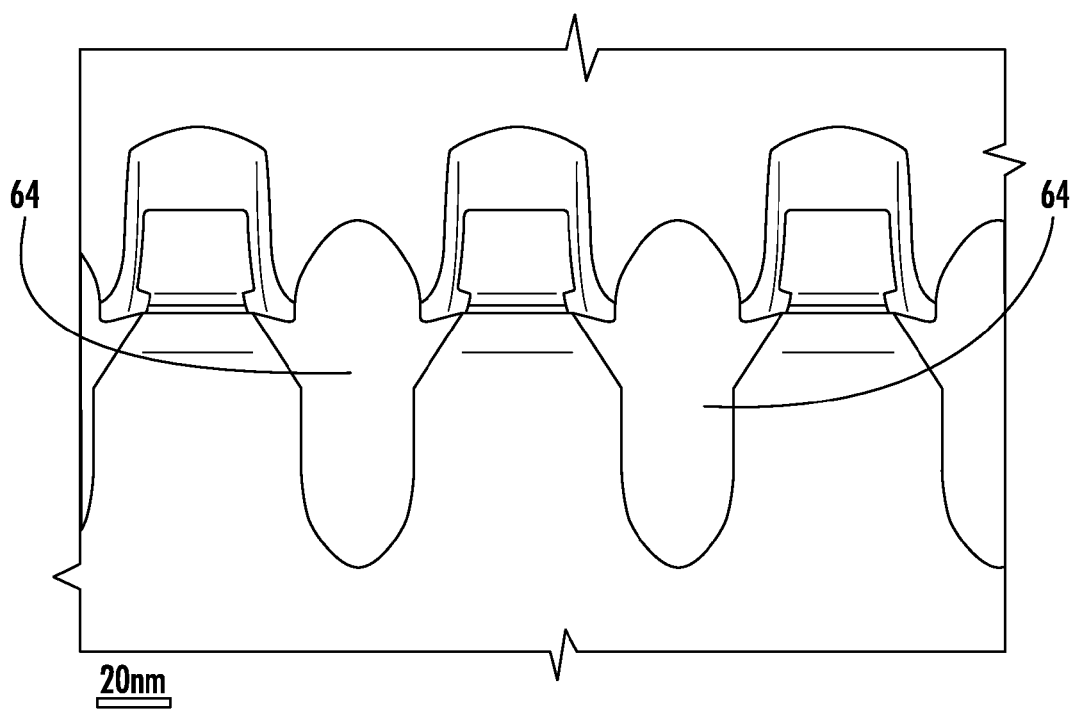
FIG. 7 is an image of a cross-sectional view of the semiconductor device shown in FIG. 6 in accordance with a non-limiting example of the present invention.
Figure 8:
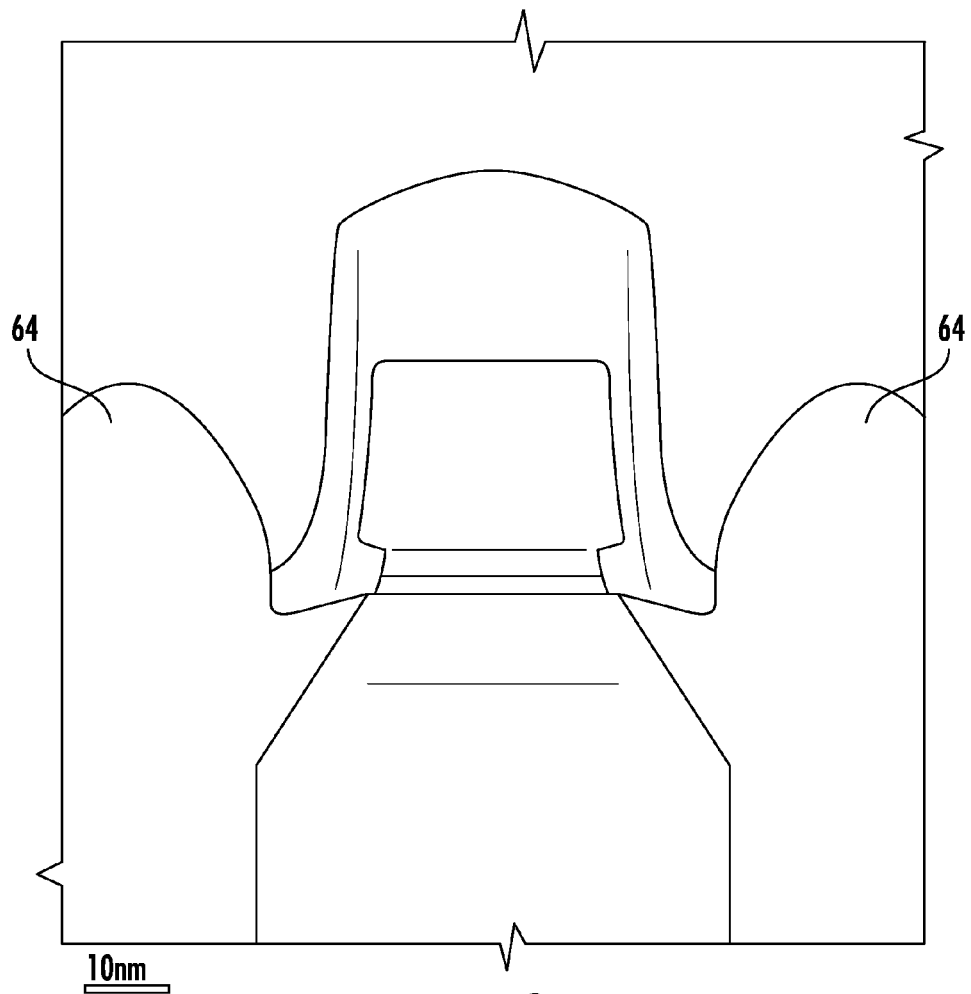
FIG. 8 is an enlarged image of a cross-sectional view of the semiconductor device shown in FIG. 7 in accordance with a non-limiting example of the present invention.

FIGS. 2-6 are cross-sectional views showing different stages in the formation of this semiconductor device as shown generally at 30 in FIG. 6 and as shown in the images as cross-sectional views in FIGS. 7 and 8. The semiconductor device 30 includes source and drain recess shapes that enhances stress boosting. This recess shape is a mix between the "sigma" shape as shown in FIG. 1 for maximum stress, and a "box" or straight shape for lower off-state leakage. Source and drain recess etching and SiGe epitaxial deposition may be performed in a same processing chamber, for example, an epitaxial reactor, as the same process step. There is thus no requirement for an in-situ high temperature prebake for the epitaxial deposition. Extension regions at the source and drain recesses may be engineered by the epitaxial deposition for optimized short channel effects and low device leakage. An example final product that can be formed by this process is a 20 nanometer (nm) CMOS semiconductor device. The SiGe epitaxial deposition may use an in-situ boron doped (ISBD) SiGe process with the Ge composition ranging from about 35% to about 60% in one non-limiting example.

Figure 2:
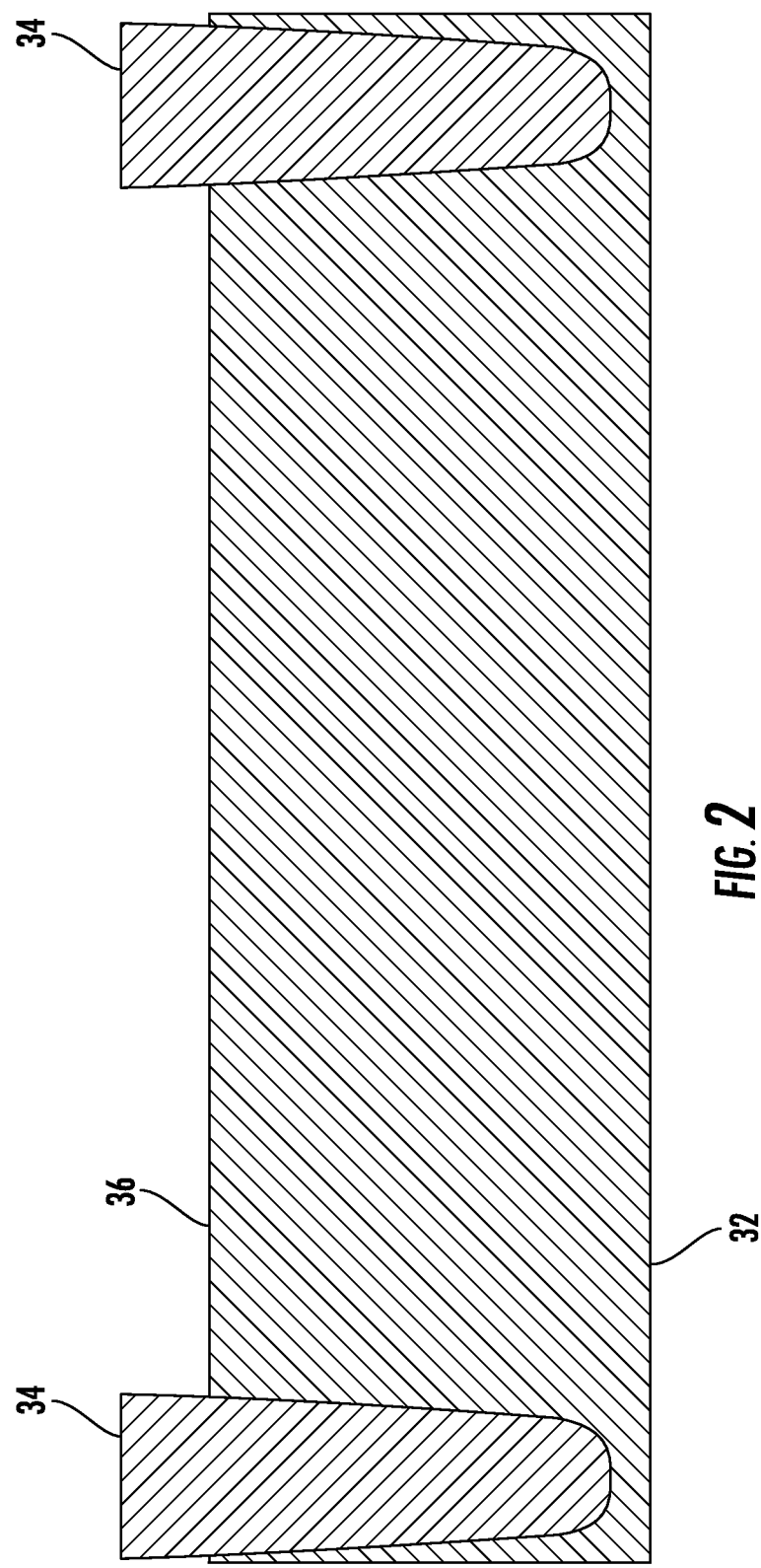
FIG. 2 is a cross-sectional view of the semiconductor device in accordance with a non-limiting example of the present invention and showing a first processing step of shallow trench isolation (STI) in a layer of first semiconductor material such as a silicon substrate to define a transistor active region.

The process steps shown in FIGS. 5-6 may be performed in a single chamber, such as an epitaxy reactor for clean surface processing while shaping the epitaxial layer. FIG. 2 illustrates a substrate 32 formed from a first semiconductor material, such as silicon, and the shallow trench isolation 34 to define an active transistor region 36. The shallow trench isolation (STI) 34 is also referred to as box isolation for integrated circuits and reduces electrical leakage and is used for CMOS manufacturing.

Figure 3:
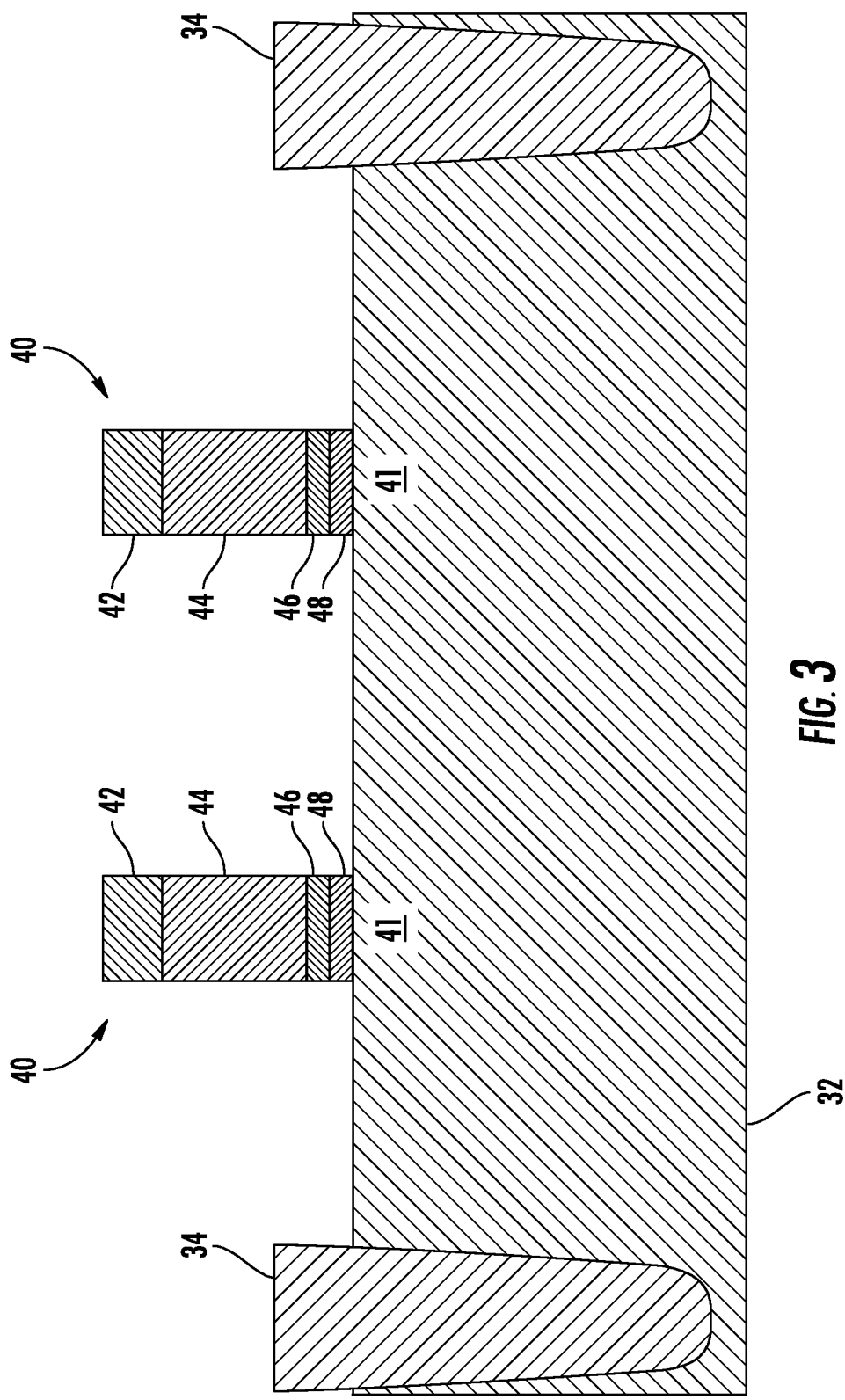
FIG. 3 is a cross-sectional view showing a second processing step of forming at least one gate stack on the layer of first semiconductor material.

FIG. 3 illustrates the gate stack deposition and patterning in which at least one gate stack 40 is formed on the layer of first semiconductor material 32 and defines a gate channel region 41. In this example of FIG. 3, two gate stacks 40 are illustrated, but it should be understood that an "n" number of gate stacks may be formed. Each gate stack 40 includes an upper silicon nitride (SiN) layer 42 applied over a polysilicon layer 44, which had been applied over a metallic layer 46 having a desired metallic work function and over an oxide layer 48 that is formed on the silicon substrate 32 as the first semiconductor material.

FIG. 4 illustrates further silicon nitride (SiN) deposition and reactive ion etching (RIE). A layer of SiN material 50 is applied at the sides of each gate stack 40 to protect the gate stack during subsequent etching and shaping of source and drain recesses as explained below.

Wafer processing for shape creation may occur in the same processing chamber as the epitaxial reactor. The wafer is loaded and the epitaxial reactor is set for depth and an etch temperature processing between 650° to 800° C., in one non-limiting example, and at a pressure from 5 TORR to about 500 TORR. Deposition occurs with Si, SiGe, SiC and other precursors: Silicon Dichlorosilane $SiH_2Cl_2$ (as the Silicon precursor), Germane ($GeH_4$), and Carbon Methylsilane ($CH_3$-$SiH_3$). Doping may occur with Boron Diborane ($B_2H_6$), Phosphorous Phosphine ($PH_3$), and Arsenic Arsine ($ASH_3$).

FIG. 5 shows anisotropic source and drain recess formation by etching source and drain recesses 52 adjacent the gate stacks 40. Etching may occur with Reactive Ion Beam (RIE).

To shape the source and drain recesses 52 to have a vertical side 54 extending upwardly from a bottom 56 to an inclined extension 58 adjacent the gate stack 40 such as shown in the semiconductor device and final processing in FIG. 6., a second semiconductor material is cyclically deposited and etched as an epitaxial silicon germanium material and preferably a silicon germanium boron Si(Ge)B material 60 in one example to form lined source and drain recesses 52. The process for source and drain recess shaping using cyclical deposition/etch is as follows: (1) wafer loading; (2) set wafer at dep/etch temperature: 650<T<800, pressure 5 Torr-500 Torr deposition with Si, SiGe, SiC, and precursors: Silicon dichlorosilane $SiH_2Cl_2$ (silicon precursor), germanium germane ($GeH_4$), carbon methylsilane ($CH_3$-$SiH_3$) and Doping: Boron diborane ($B_2H_6$), Phosphorus Phosphine ($PH_3$), Arsenic arsine ($AsH_3$); and (3) followed by etching with HCl at a typical flow of 100 sccm to 20 slm. Steps (2) and (3) are repeated "n" times until the final shape is created.

These source and drain recesses 52 that are lined with the Si(Ge)B material 60 are filled with a second semiconductor material as an epitaxial layer SiGe fill 62 and define raised source and drain regions 64 as best illustrated in FIGS. 7 and 8.

As noted before, the cyclical depositing, etching and filling are advantageously performed in a same processing chamber, such as an epitaxy reactor. The first and second semiconductor materials may be different semiconductor materials so that stress is imparted to the channel region 41 under the gate stacks 40. The first semiconductor material as noted before is formed as silicon, and the second semiconductor material as noted before is formed as silicon and germanium (SiGe) with Si(Ge)B being used for the material 60 lining the source and drain recesses 52. As best shown in FIG. 6, the inclined extension 58 in an example has a vertical dimension less than a vertical dimension of the vertical side 54, and in another example, the inclined extension has a vertical dimension less than a half a vertical dimension of the vertical side. The bottom 56 has a tapered shape as best shown in the cross-sectional image of FIG. 7.

The epitaxially deposited layer is typically silicon germanium with the germanium content ranging from about 25% to about 60% to impart compressive stress. The same range of pressures may be applied in the same processing chamber as an epitaxy reactor with the pressures ranging from about 5 TORR to about 500 TORR and the temperature ranging from about 500° C. to about 800° C. Deposition may occur with Si, SiGe precursors as noted before and doping may occur with the same dopants as noted before.

FIG. 7 is a sectional view of an image of the semiconductor device 30 of FIG. 6.

FIG. 8 is an enlarged sectional view showing an image of a portion of the semiconductor device shown in FIG. 7 and showing greater details of a 2.5 nm intrinsic silicon liner for the source and drain recesses 52. In this example, the Germanium content is about 35% for the in-situ boron doped (ISBD) process.

Figure 9:
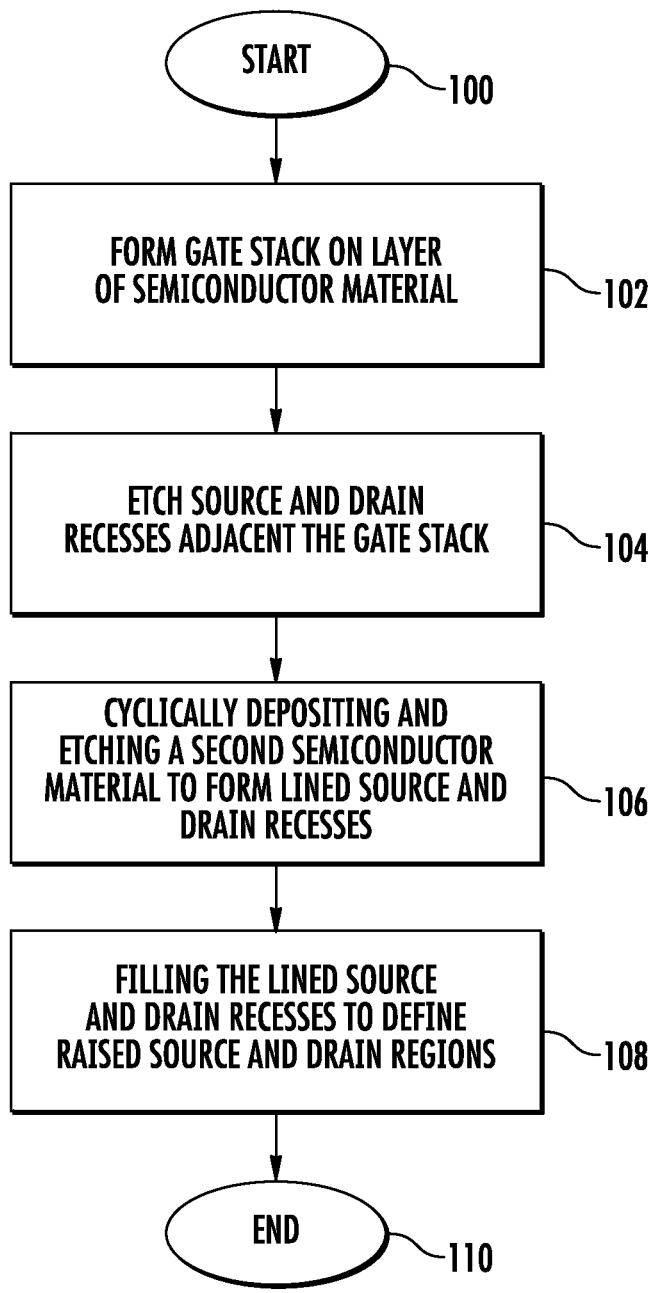
FIG. 9 is a flowchart illustrating a method for making the semiconductor device in accordance with a non-limiting example.

FIG. 9 is a high level flowchart illustrating a method for making the semiconductor device as shown in FIGS. 6-8 in accordance with a non-limiting example. The process starts at block 100 and the gate stacks are formed on the silicon semiconductor material (block 102). The source and drain recesses are etched adjacent the at least one gate stack (block 104). Lined source and drain regions are formed by cyclically depositing and etching "n" times a second semiconductor material as silicon and germanium (block 106). The lined source and drain recesses are filled to define raised source and drain regions (block 108). The process ends (block 110).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
   a layer comprising a first semiconductor material;
   at least one gate stack on said layer;
   source and drain regions comprising a second semiconductor material adjacent said at least one gate stack;
   each source and drain region having a bottom, a vertical side extending upwardly from the bottom, and an inclined extension extending from the vertical side adjacent the at least one gate stack, said bottom including at least one upwardly angled section that joins the vertical side; and
   a liner between each source and drain region and adjacent portions of said layer, said liner comprising the second semiconductor material having a dopant therein.

2. The semiconductor device according to claim 1 wherein the dopant of said liner comprises boron.

3. The semiconductor device according to claim 1 wherein the first semiconductor material comprises silicon.

4. The semiconductor device according to claim 1 wherein the second semiconductor material comprises silicon and germanium.

5. The semiconductor device according to claim 1 wherein said source and drain regions comprise raised source and drain regions.

6. The semiconductor device according to claim 1 wherein said layer comprises a channel region under said at least one gate stack; and wherein the first and second semiconductor materials are different semiconductor materials so that stress is imparted to the channel region.

7. The semiconductor device according to claim 1 wherein the inclined extension has a vertical dimension less than a vertical dimension of the vertical side.

8. The semiconductor device according to claim 1 wherein the inclined extension has a vertical dimension less than half a vertical dimension of the vertical side.

9. The semiconductor device according to claim 1 wherein the bottom has a tapered shaped.

10. A semiconductor device comprising:
    a layer comprising a first semiconductor material;
    at least one gate stack on said layer;
    raised source and drain regions comprising a second semiconductor material adjacent said at least one gate stack;
    each raised source and drain region having a bottom, a vertical side extending upwardly from the bottom, and an inclined extension extending from the vertical side adjacent the at least one gate stack, said bottom including an upwardly angled section that joins the vertical side; and
    a liner between each raised source and drain region and adjacent portions of said layer, said liner comprising the second semiconductor material having boron as a dopant therein.

11. The semiconductor device according to claim 10 wherein the first semiconductor material comprises silicon.

12. The semiconductor device according to claim 10 wherein the second semiconductor material comprises silicon and germanium.

13. The semiconductor device according to claim 10 wherein said layer comprises a channel region under said at least one gate stack; and wherein the first and second semiconductor materials are different semiconductor materials so that stress is imparted to the channel region.

14. The semiconductor device according to claim 10 wherein the inclined extension has a vertical dimension less than a vertical dimension of the vertical side.

15. The semiconductor device according to claim 10 wherein the inclined extension has a vertical dimension less than half a vertical dimension of the vertical side.

16. The semiconductor device according to claim 10 wherein the bottom has a tapered shaped.

17. A semiconductor device comprising:
    a layer comprising a first semiconductor material;
    at least one gate stack on said layer;
    source and drain regions comprising a second semiconductor material adjacent said at least one gate stack;

each source and drain region having a tapered bottom, a vertical side extending upwardly from the tapered bottom, and an inclined extension extending from the vertical side adjacent the at least one gate stack; and a liner between each source and drain region and adjacent portions of said layer, said liner comprising the second semiconductor material having a dopant therein;

said layer comprising the first semiconductor material comprising a channel region under said at least one gate stack, and the first and second semiconductor materials being different semiconductor materials so that stress is imparted to the channel region.

18. The semiconductor device according to claim 17 wherein the dopant of said liner comprises boron.

19. The semiconductor device according to claim 17 wherein the first semiconductor material comprises silicon.

20. The semiconductor device according to claim 17 wherein the second semiconductor material comprises silicon and germanium.

21. The semiconductor device according to claim 17 wherein said source and drain regions comprise raised source and drain regions.

22. The semiconductor device according to claim 17 wherein the inclined extension has a vertical dimension less than a vertical dimension of the vertical side.

23. The semiconductor device according to claim 17 wherein the inclined extension has a vertical dimension less than half a vertical dimension of the vertical side.

* * * * *